(12) United States Patent
Boecker et al.

(10) Patent No.: US 7,092,689 B1
(45) Date of Patent: Aug. 15, 2006

(54) CHARGE PUMP HAVING SAMPLING POINT ADJUSTMENT

(75) Inventors: Charles W. Boecker, Ames, IA (US); Brian T. Brunn, Austin, TX (US)

(73) Assignee: Xilinx Inc., San Jose, CA (US)

( * ) Notice: Subject to any disclaimer, the term of this patent is extended or adjusted under 35 U.S.C. 154(b) by 515 days.

(21) Appl. No.: 10/660,235

(22) Filed: Sep. 11, 2003

(51) Int. Cl.
*H04B 1/06* (2006.01)
(52) U.S. Cl. .................. 455/260; 455/126; 455/180.3; 455/263
(58) Field of Classification Search ................ 455/260, 455/263, 264–265, 255–259, 118, 195.1, 455/180.3, 126, 143, 139; 375/373, 376; 331/1 R, 175
See application file for complete search history.

(56) References Cited

U.S. PATENT DOCUMENTS

| | | | | |
|---|---|---|---|---|
| 5,334,953 | A * | 8/1994 | Mijuskovic ..................... | 331/8 |
| 5,508,660 | A * | 4/1996 | Gersbach et al. ............. | 331/17 |
| 5,604,926 | A * | 2/1997 | Pace et al. ................... | 455/260 |
| 5,933,037 | A * | 8/1999 | Momtaz ..................... | 327/157 |
| 5,943,382 | A * | 8/1999 | Li et al. ...................... | 375/376 |
| 6,040,742 | A * | 3/2000 | Bailey et al. .................. | 331/2 |
| 6,087,902 | A * | 7/2000 | Larsson ....................... | 331/25 |
| 6,622,010 | B1 * | 9/2003 | Ichimaru ..................... | 455/76 |
| 7,009,432 | B1 * | 3/2006 | Beghein ..................... | 327/157 |
| 7,010,285 | B1 * | 3/2006 | Dhuna ........................ | 455/260 |

OTHER PUBLICATIONS

U.S. Appl. No. 10/660,234, filed Sep. 11, 2003, Boecker.
U.S. Appl. No. 10/660,449, filed Sep. 11, 2003, Cory et al.
U.S. Appl. No. 10/660,191, filed Sep. 11, 2003, Kryzak et al.
U.S. Appl. No. 10/660,062, filed Sep. 11, 2003, Groen et al.
U.S. Appl. No. 10/660,448, filed Sep. 11, 2003, Groen et al.
U.S. Appl. No. 10/659,803, filed Sep. 11, 2003, Black et al.
U.S. Appl. No. 10/659,819, filed Sep. 11, 2003, Groen et al.
U.S. Appl. No. 10/659,971, filed Sep. 11, 2003, Boecker et al.
U.S. Appl. No. 10/660,254, filed Sep. 11, 2003, Groen et al.
U.S. Appl. No. 10/661,016, filed Sep. 11, 2003, Groen et al.
U.S. Appl. No. 10/659,979, filed Sep. 11, 2003, Kryzak et al.
U.S. Appl. No. 10/659,974, filed Sep. 11, 2003, Kryzak et al.

(Continued)

*Primary Examiner*—Pablo N. Tran
(74) *Attorney, Agent, or Firm*—James Harrison

(57) ABSTRACT

Adjustment circuitry in a phase-locked loop (PLL) adjusts a sampling point to any desired location within a bit period of each bit of received high-speed serial data. The adjustment circuitry, responsive to program control, selectively adds current portions to a charge pump error current output thereby adjusting a feedback signal frequency to shift the serial data sampling point. A plurality of current mirror devices is scaled, with respect to a reference current device, to provide ΔI current portions. A current control module controls the current portions magnitude and a sign of the current portions. The adjustment circuitry further controls charge pump programmable current sources in order to set a desired operating point of the PLL. The programmable current sources are controlled by a bias voltage and a plurality of selectable serial and parallel coupled resistors.

16 Claims, 15 Drawing Sheets phase-locked loop 170

OTHER PUBLICATIONS

U.S. Appl. No. 10/660,159, filed Sep. 11, 2003, Groen et al.
U.S. Appl. No. 10/660,016, filed Sep. 11, 2003, Jenkins.
U.S. Appl. No. 10/659,973, filed Sep. 11, 2003, Groen et al.
U.S. Appl. No. 10/660,190, filed Sep. 11, 2003, Groen.
U.S. Appl. No. 10/659,916, filed Sep. 11, 2003, Black et al.
U.S. Appl. No. 10/659,978, filed Sep. 11, 2003, Groen et al.
U.S. Appl. No. 10/659,972, filed Sep. 11, 2003, Shafer.
U.S. Appl. No. 10/659,966, filed Sep. 11, 2003, Chuang et al.

* cited by examiner programmable logic device 10 programmable multi-gigabit
transceivers 14-28 programmable multi-gigabit transceivers 14-28

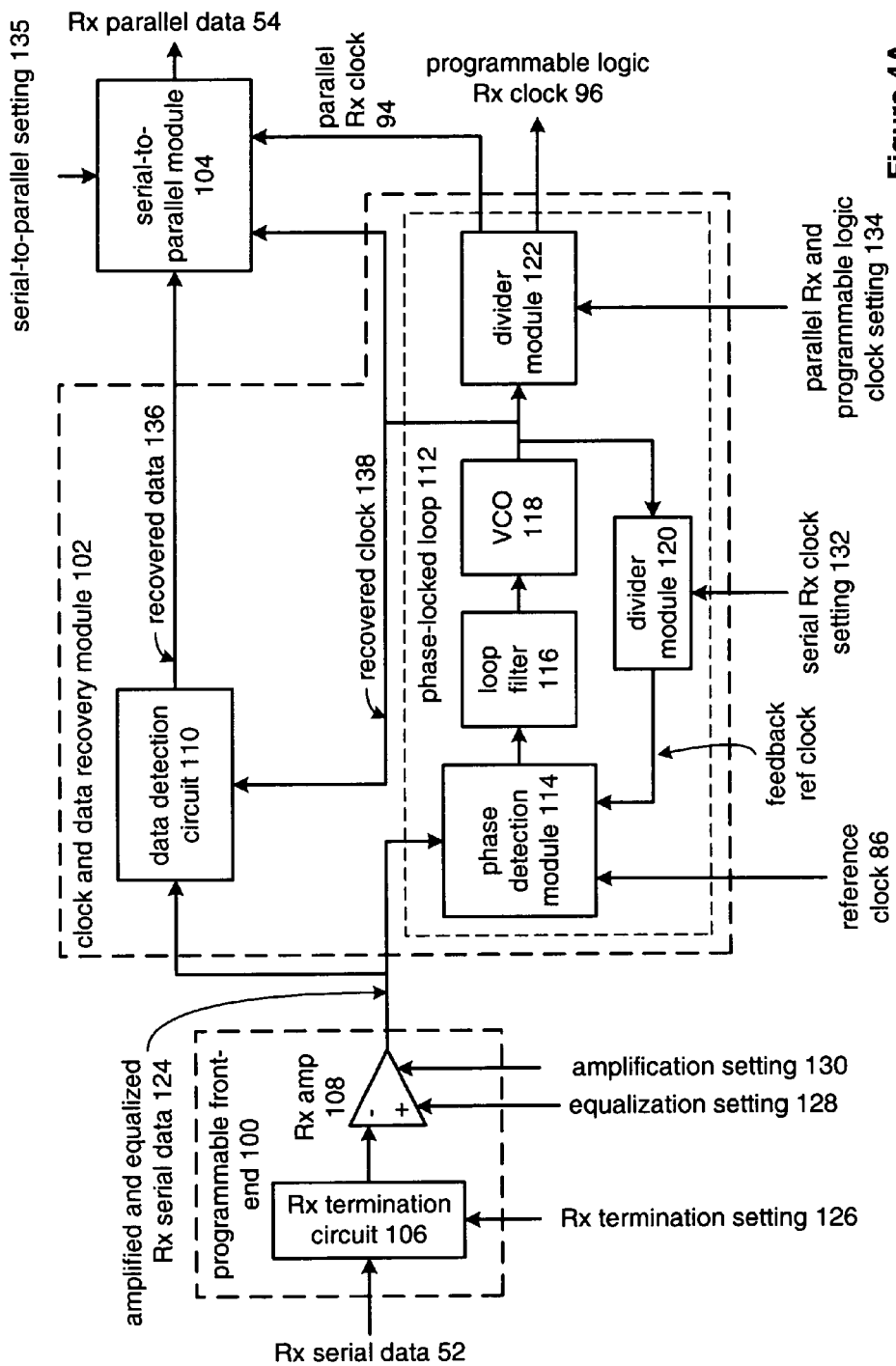
Figure 4A programmable r_ceiv PMA module 40 programmable transmit
PMA module 38 phase-locked loop 170 charge pump 178 adjustment circuitry 190 adjustable current source adjustable resistor 274 charge pump alternate embodiment phase detection module phase detection module 350 serial data eye diagram

PLL sampling point adjustment method

CHARGE PUMP HAVING SAMPLING POINT ADJUSTMENT

BACKGROUND OF THE INVENTION

1. Technical Field of the Invention

This invention relates generally to communication systems and more particularly to clock recovery circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, currently provides for transmission of 10 gigabits per second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINI-BAND) or 3.125 gigabits per second (XAUI). These different data rates affect the allowable rise and fall time of the signal, the peak amplitude of the signal and the response time from an idle state. For example, one protocol may specify a peak voltage range of 200–400 millivolts, while another standard specifies a mutually exclusive voltage range of 500–700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed.

One design challenge for serial data processing, especially for high data rate communications, relates to testing the high-speed circuits for performance verification. Verification of bit error rates (BERs) is one such test. BER specifications range from $10^{-12}$ to as much as $10^{-16}$. Testing these bit error rates can take days, and thus is not suitable for production environments. A need exists, therefore, for a device and accompanying method to verify BER performance in a cost effective manner. Along these lines, sources of error often require attention to reduce phase noise and jitter in a clock used for transmission and/or data recovery. One source of error is the current sources used to bias circuit devices. Semiconductor noise such as 1/f noise and shot noise appears as additional current components that contribute to clock jitter. Manufacturing process variations contribute to mismatch in circuit devices thereby affecting the operating point of the current sources. These errors combine to cause an offset in a sampling point used in clock and data recovery circuits. Additionally, a need exists for a device and accompanying method to shift the sampling point in clock and data recovery circuits.

BRIEF SUMMARY OF THE INVENTION

The present invention provides for a device and a method for adjusting a sampling point for high-speed serial data. Adjustment circuitry in a charge pump of a phase-locked loop selectively sinks current from an error current produced at a pair of summing points to a loop filter in order to adjust a control voltage of a voltage controlled oscillator (VCO). The adjusted VCO control voltage causes an instantaneous change in a frequency of oscillation of the VCO which is produced to a clock and data recovery (CDR) module as a feedback signal with a phase shift. The change in oscillation frequency causes a relative phase change between the feedback signal and the incoming high-speed serial data thus changing the sampling point of the high-speed serial data.

A current control module in the adjustment circuitry adjusts a plurality of current mirror devices to sink a ΔI current from one of a positive current summing point and a negative current summing point. The magnitude of the ΔI current that is sinked from the summing points causes the error current produced by the charge pump to accordingly increase or decrease thereby changing a VCO oscillation frequency and phase.

A plurality of current mirrors within the adjustment circuitry includes a plurality of current mirror devices coupled to the current summing points by MOSFET switches. A magnitude signal from the current control module selects at least one MOSFET switch to couple a current from at least one current mirror device to the current summing points. The ΔI current sinked by the plurality of current mirror devices is controlled by selectively coupling additional current mirror devices to the current summing points. Identical circuits are coupled to sink current from positive and negative current summing points.

By adjusting the error current, the change in oscillation frequency and phase results in a change in the sampling point of the high-speed serial data as mentioned above. Selectively increasing the error current causes a subsequent shift in the sampling point on the high-speed serial data and may be used to move the sampling point to the extreme edges of an eye diagram.

BRIEF DESCRIPTION OF THE DRAWINGS

FIG. 4A illustrates a schematic block diagram of a programmable receive PMA module that includes a programmable front-end, a data and clock recovery module, and a serial-to-parallel module;

DETAILED DESCRIPTION OF THE INVENTION

Figure 1:
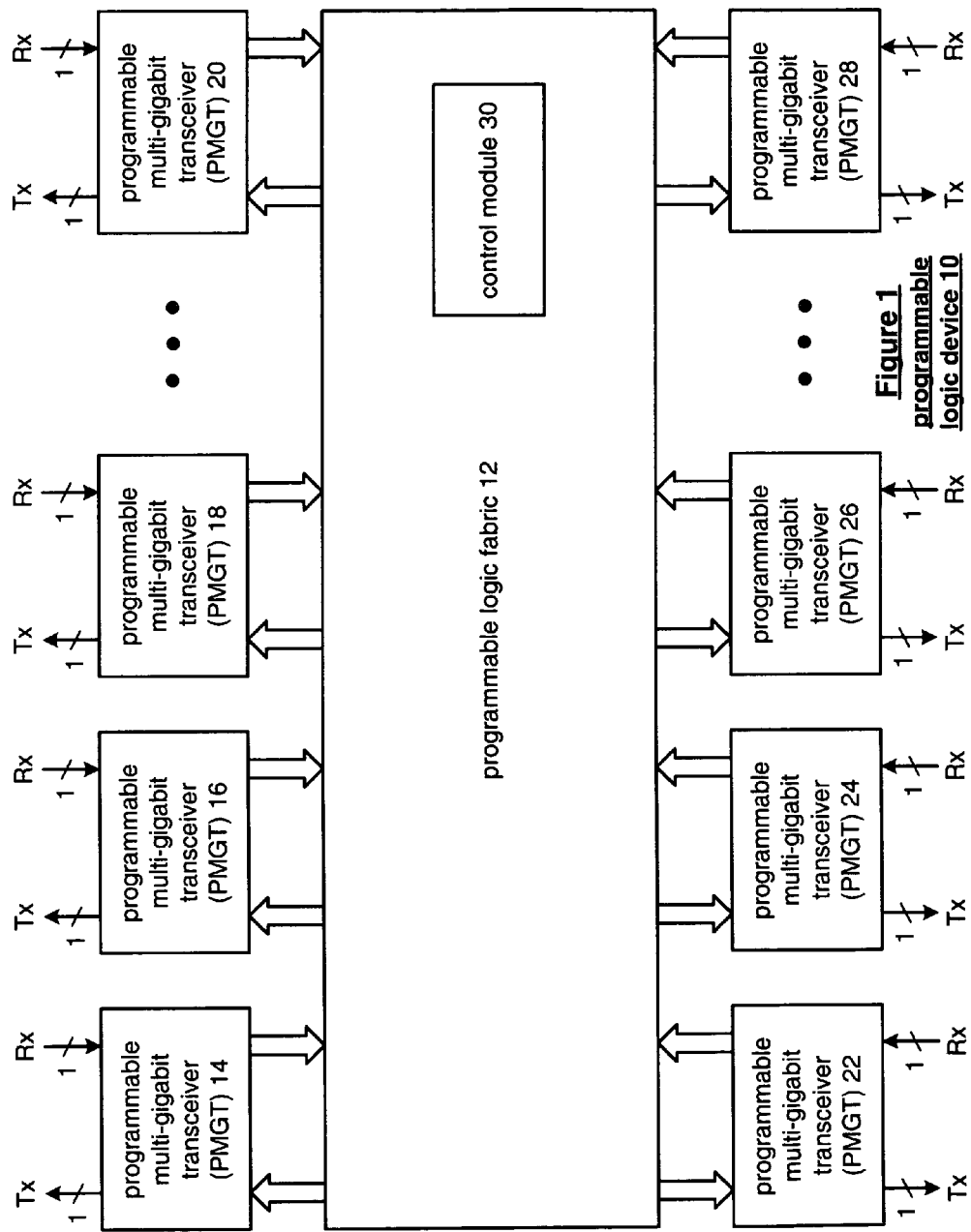
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be programmable logic devices, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, the control module 30 generates the control signals to program each of the transmit and receive sections of the PMGTs 14–28. In general, each of the PMGTs 14–28 performs a serial-to-parallel conversion on received data and performs a parallel-to-serial conversion on transmit data. The parallel data may be, for instance, 8-bits, 16-bits, 32-bits, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits per second, the PMGTs 14, 16 and 18 may be bonded together such that the effective serial rate is approximately 3 times 3.125 gigabits per second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial rates of the transmit path and receive path may be programmed, for example, from 1 gigabit per second to tens of gigabits per second. The size of the parallel data in the transmit and receive sections, or paths, is also programmable and may vary, for instance, may be 8-bits, 16-bits, 32-bits, or 64-bits wide.

Figure 2:
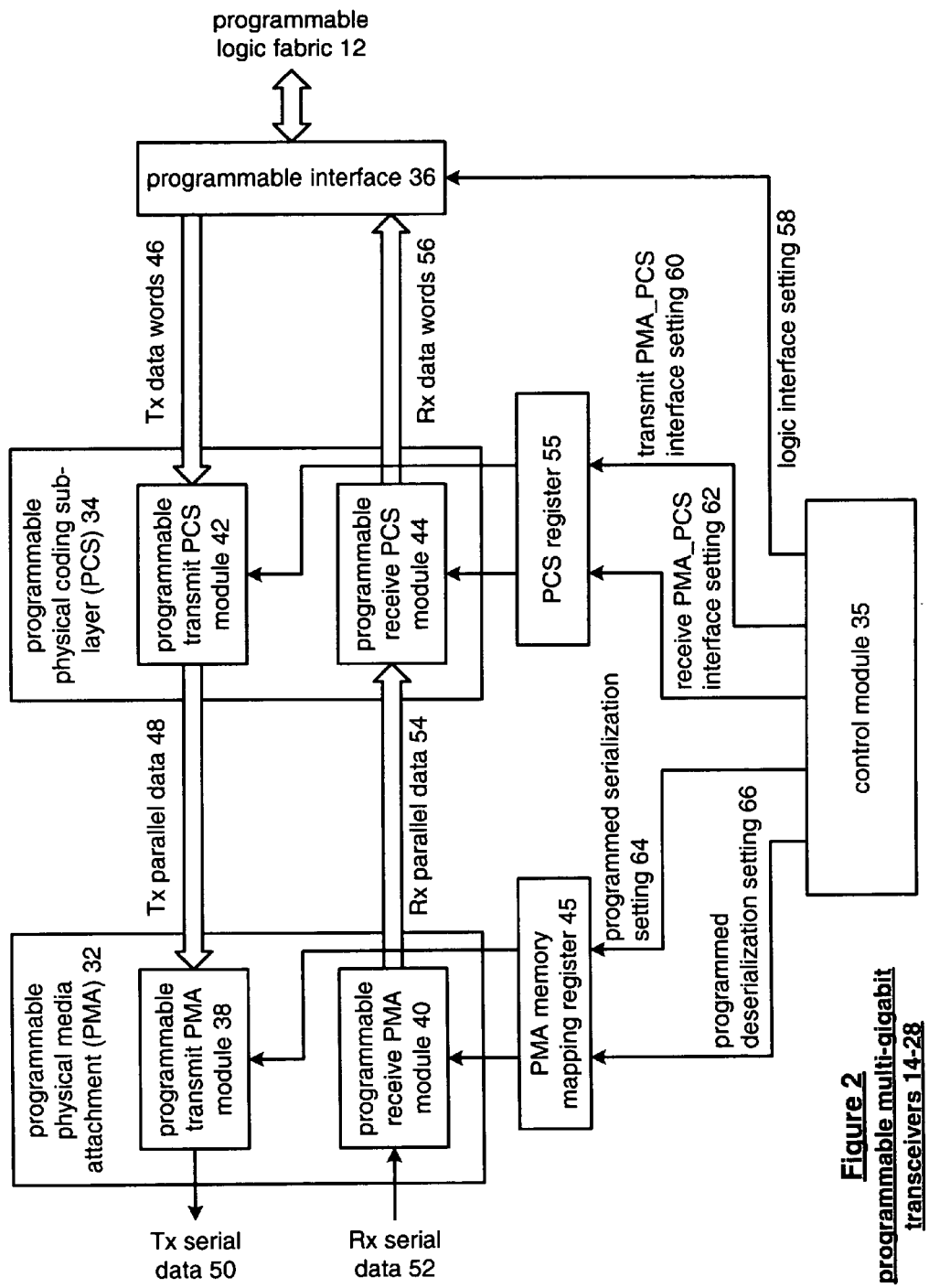
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14–28. AS shown, the programmable multi-gigabit transceiver includes a programmable physical media attachment (PMA) 32, a programmable physical coding sub-layer (PCS) 34, a programmable interface 36, a control module 35, a PMA memory mapping register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

Figure 4B:
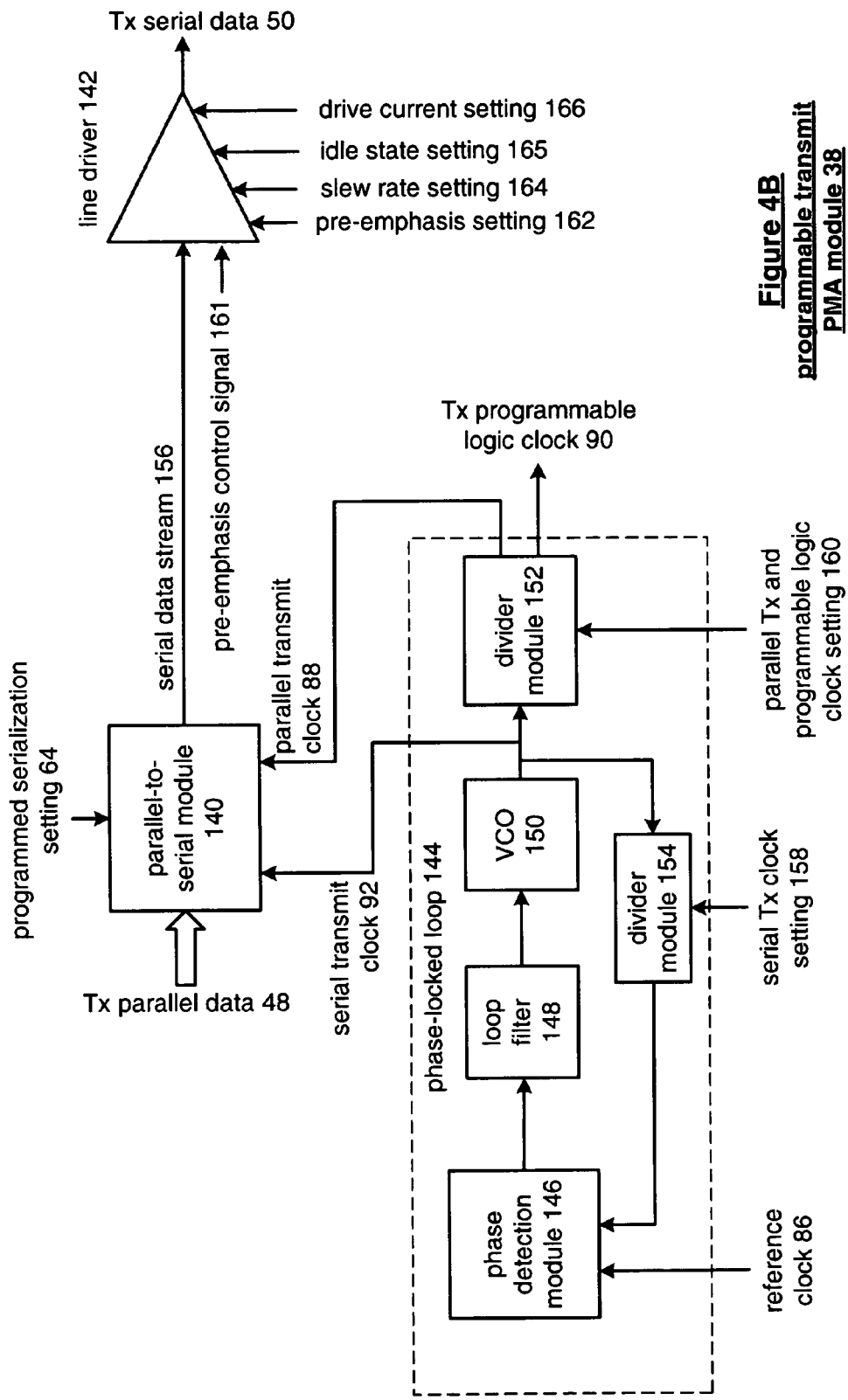
FIG. 4B illustrates a schematic block diagram of a programmable transmit PMA module that includes a phase-locked loop, a parallel-to-serial module, and a line driver.

The programmable physical media attachment (PMA) 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA 32 and the programmable PCS 34 may be individually programmed to support a desired data transfer rate. The data transfer rate may be in accordance with a particular standard such that the receive path, i.e., the path through programmable receive PMA module 40 and the programmable receive PCS module 44, may be programmed in accordance with one standard, while the transmit path, i.e., the path through the programmable transmit PCS module 42 and the programmable transmit PMA module 38, may be programmed in accordance with the same or another standard.

Figure 3:
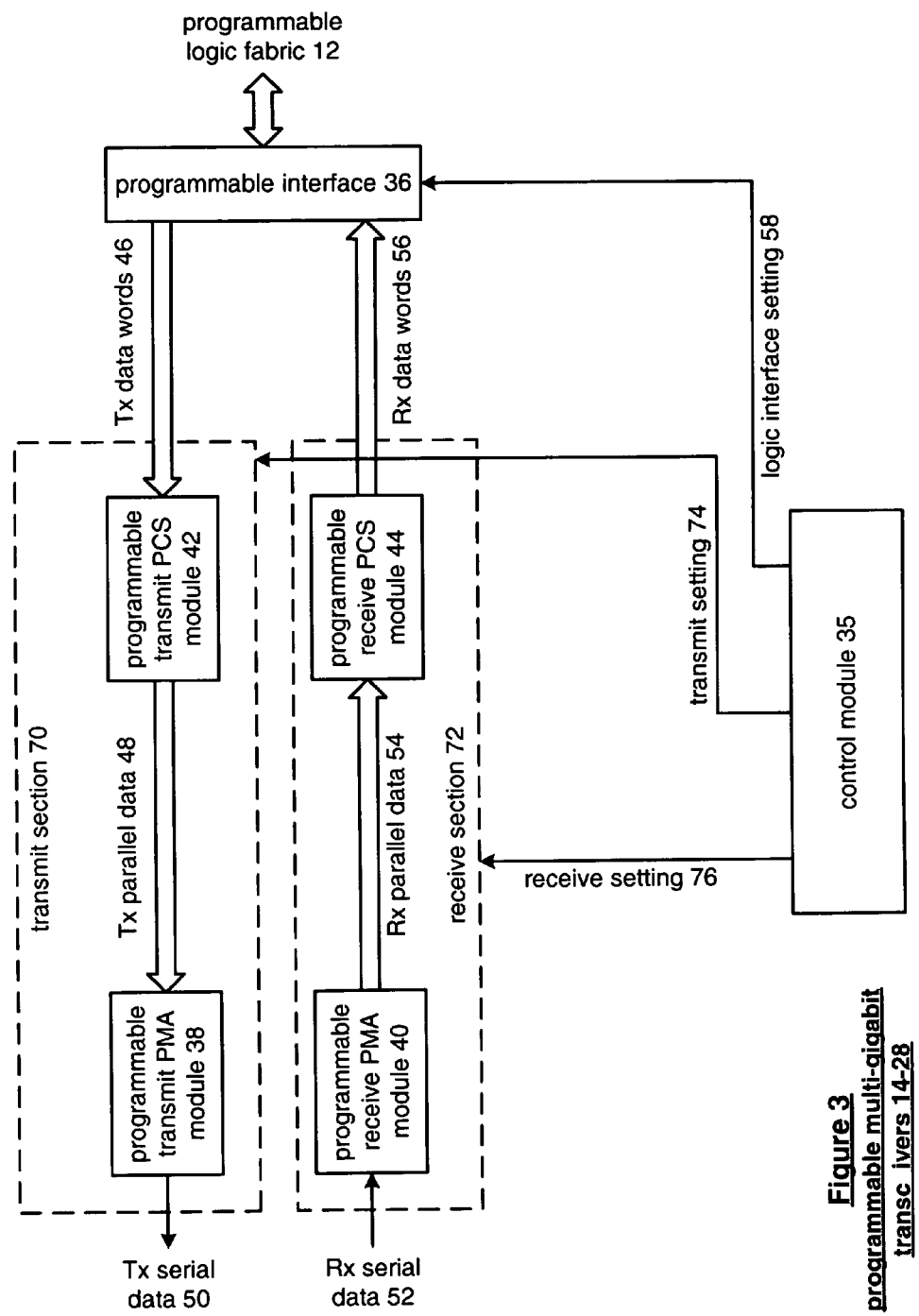
FIG. 3 illustrates an alternate schematic block diagram of a representative one of the programmable multi-gigabit transceivers.

FIG. 3 illustrates an alternate schematic block diagram of a representative one of the PMGTs 14–28. In this embodiment, the PMGTs 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of receive data words 56 and transmit data words 46 to and from the programmable logic fabric 12.

FIG. 4A illustrates a schematic block diagram of the programmable receive PMA module 40 that includes a programmable front-end 100, a clock and data recovery (CDR) module 102, and a serial-to-parallel module 104. The programmable front-end 100 includes a receive termination circuit 106 and a receive amplifier 108. The CDR module 102 includes a data detection circuit 110 and a phase-locked loop 112. The phase-locked loop 112 includes a phase detection module 114, a loop filter 116, a voltage controlled oscillator (VCO) 118, a first divider module 120, and a second divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the transmission line, and may indicate the biasing of the receive termination circuit 106. For a more detailed discussion of the receive termination circuit 106, refer to co-pending patent application entitled "RECEIVER TERMINATION NETWORK AND APPLICATION THEREOF" by Charles W. Boecker, William C. Black, and Eric D. Groen, having the same filing date as the present application.

The receive termination circuit 106 further biases the receive serial data 52 and provides the bias adjusted signal to the receive amplifier 108. The equalization and gain settings of the receive amplifier 108 may be adjusted in accordance with equalization setting 128 and amplification setting 130, respectively. Further description of the receive amplifier 108 may be found in co-pending patent application entitled "ANALOG FRONT-END HAVING BUILT-IN EQUALIZATION AND APPLICATIONS THEREOF" by William C. Black, Charles W. Boecker, and Eric D. Groen, having a filing date the same as the present patent application. Note that the receive termination setting 126, the equalization setting 128, and the amplification setting 130 are part of the programmed deserialization setting 66 provided by the control module 35.

The CDR module 102 receives the amplified and equalized receive serial data 124 via the phase detection module 114 of phase-locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current signal that is provided to loop filter 116. The loop filter 116 converts the current into a control voltage that adjusts the output frequency of the VCO 118. The divider module 120, based on a serial receive clock setting 132, divides the output oscillation produced by the VCO 118 to produce the feedback reference clock. Once the amplified and equalized receive serial data 124 is received, the phase detection module 114 compares the phase of the amplified and equalized receive serial data 124 with the phase of the feedback reference clock, and produces a current signal based on the phase difference.

The phase detection module 114 provides the current signal to loop filter 116, which converts it into a control voltage that controls the output frequency of the VCO 118. At this point, the output of the VCO 118 corresponds to a recovered clock 138 in steady state operation. The recovered clock 138 is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the data rate and data width of the receive parallel data 54.

FIG. 4B illustrates a schematic block diagram of a programmable transmit PMA module 38 that includes a phase-locked loop 144, a parallel-to-serial module 140, and a line driver 142. The phase-locked loop 144 includes a phase detection module 146, a loop filter 148, a voltage controlled oscillator (VCO) 150, a divider module 154, and a divider module 152.

The phase detection module 146 compares the phase and/or frequency of the reference clock 86 with the phase and/or frequency of an output (feedback reference clock) produced by divider module 154. The phase detection module 146 generates control signals to loop filter 148 which, in turn, produces a current signal to represent the phase and/or frequency difference between the reference clock 86 and the feedback oscillation to loop filter 148. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic store buffer, receives a parallel-to-serial setting, which may be part of programmed serialization setting 64, to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the signals forming serial data stream 156 to produce the transmit serial data 50. The line driver 142, which is described in greater detail in co-pending related applications listed above and having the same filing date as the present application, may be programmed to adjust its pre-emphasis settings, slew rate settings, and drive settings via a pre-emphasis control signal 161, a pre-emphasis setting 162, a slew rate setting 164, an idle state setting 165 and a drive current setting 166. The pre-emphasis control signal 161, the pre-emphasis setting 162, the slew rate setting 164, the idle state setting 165 and the drive current setting 166 may be part of the programmed serialization setting 64. As one of average skill in the art will appreciate, while the diagram of FIG. 4B is shown as a single-ended system, the entire system may use differential signaling and/or a combination of differential and single-ended signaling. Further details on the line driver 142 are described in co-pending patent application entitled DAC BASED DRIVER WITH SELECTABLE PRE-EMPHASIS SIGNAL LEVELS, by Eric D. Groen et al., and having a filing date the same as the present patent application and in co-pending patent application entitled TX LINE DRIVER WITH COMMON MODE IDLE STATE AND SELECTABLE SLEW RATES, by Eric D. Groen et al. and having a filing date the same as the present patent application. These co-pending applications are incorporated by reference, herein.

Figure 5:
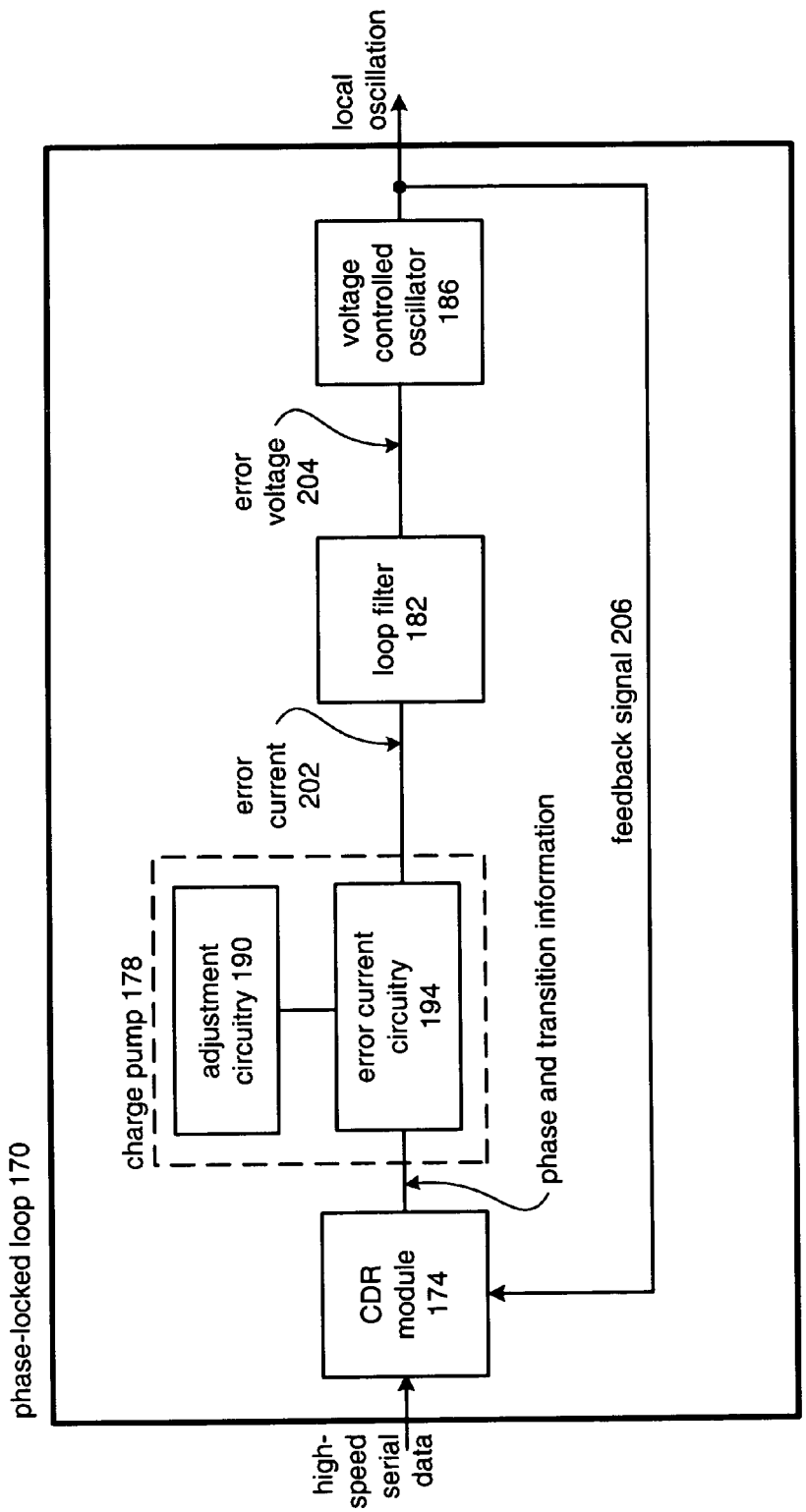
FIG. 5 is a schematic block diagram of a phase-locked loop for adjusting a sampling point for high-speed serial data according to one embodiment of the present invention.

FIG. 5 is a schematic block diagram of a phase-locked loop for adjusting a sampling point for high-speed serial data according to one embodiment of the present invention. Phase-locked loop 170 comprises a clock and data recovery (CDR) module 174, a charge pump 178, a loop filter 182, and a voltage controlled oscillator 186. A local oscillation signal produced from voltage controlled oscillator 186 is coupled to CDR module 174 as feedback signal 206. The CDR module 174 is coupled to receive the high-speed serial data and produce therefrom phase information and transition information representing a state of the high-speed serial data at a sampling point determined by a transition of feedback signal 206.

Charge pump 178, comprising adjustment circuitry 190 and error current circuitry 194, receives the phase and transition information and produces an error current 202 that is based upon the phase information and transition information. Error current 202, produced from charge pump 178, is coupled to loop filter 182, which converts the error current 202 into an error voltage 204 that is proportional to the error current 202. Voltage controlled oscillator 186 receives the error voltage 204 from loop filter 182 and produces a local oscillation responsive thereto.

Phase-locked loop 170 functions to maintain feedback signal 206 transition centered in a bit period of the high-speed serial data. One aspect of the present invention is to adjust error current 202 to move feedback signal 206 transition to any point within a bit period of the high-speed serial data. Adjustment circuitry 190 selectively adds and subtracts ΔI current portions to error current 202, which changes the local oscillation phase and frequency produced by voltage controlled oscillator 186. The change in local oscillation phase and frequency correspondingly adjusts the timing of the feedback signal 206 transitions (logic level changes) relative to the high-speed serial data, thereby moving or adjusting the sampling point. The operation of adjustment circuitry 190 will be discussed with respect to the following figures.

Figure 6:
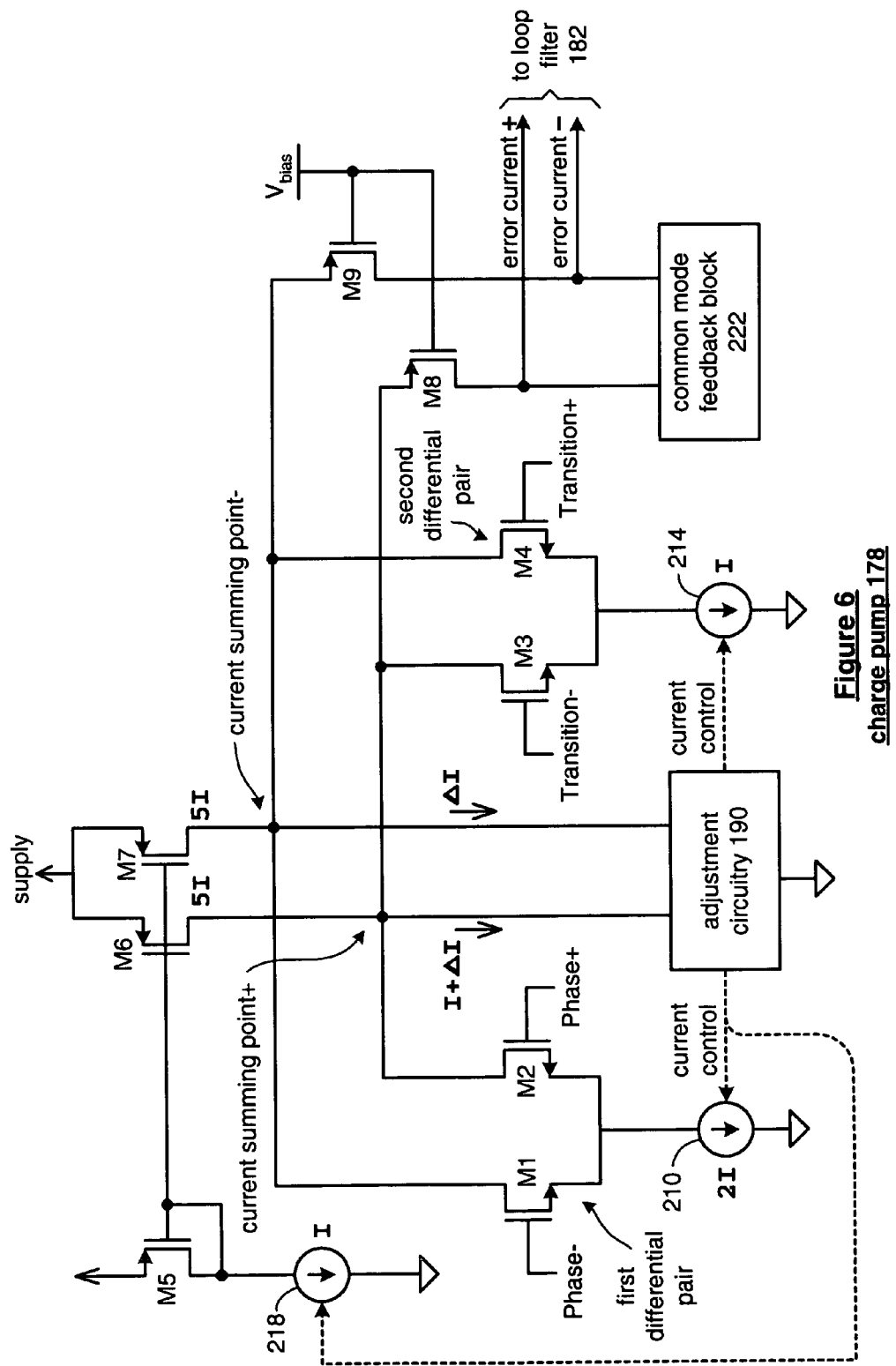
FIG. 6 is a schematic block diagram of a charge pump according to one embodiment of the present invention.

FIG. 6 is a schematic diagram of charge pump 178 according to one embodiment of the present invention. The phase information is received into a first differential pair comprising transistors M1 and M2, while the transition information is received into a second differential pair comprising transistors M3 and M4. A plurality of current sources, namely, current sources 210, 214, and 218, provide biasing within charge pump 178. Current source 210 provides a bias current of 2I to the first differential pair, namely, transistors M1 and M2, while current source 214 produces a bias current of I to the second differential pair, namely, transistors M3 and M4. Current source 218 provides a bias current of I to a reference device of a current mirror that produces a current of 5I that is sinked by current sources (sinks) 210 and 214 and by adjustment circuitry 190 with the remainder being produced to output devices M8 and M9. When phase-locked to the center of a bit period, the phase information is typically one-half the period of the transition information. Accordingly, the bias current produced by current source 210 to the first differential pair is twice the current supplied by current source 214 to the second differential pair, thereby generating an equal error current to the summing nodes. The net current produced to and sinked from the summing nodes is zero when the VCO is phase-locked, meaning the error current is not adjusted.

The current mirror provides an active load and also supplies (sources) current to the positive current summing point and negative current summing point. The current mirror comprises a reference current device M5, which is a diode connect transistor coupled between a supply and current source 218. The gate of reference current device M5 is further coupled to the gates of mirror devices M6 and M7 which further have their sources connected to supply and drains coupled to the positive current summing point and the negative current summing point, respectively. Mirror devices M6 and M7 supply a current of approximately 5I relative to the current I flowing through reference current device M5. As is known to one of average skill in the art, the aspect ratio (width/length) of a mirror device to a reference current device determines the magnitude of the current that flows through the mirror device. In one embodiment of the present invention, the aspect ratio of mirror device M6 to reference current device M5 is approximately equal to 5. Likewise, the aspect ratio of mirror device M7 to reference current device M5 is also approximately equal to 5. Thus, mirror devices M6 and M7 will produce approximately 5 times the current of reference current device M5. Cascode devices M8 and M9 (output devices) provide a high impedance output to loop filter 182 (not shown). A common mode feedback block (CMFB) 222 removes a common mode current from the differential output error current produced to loop filter 182.

Adjustment circuitry 190 functions to subtract current from the positive and negative current summing points to shift the transition of the feedback signal relative to the transition of the phase information thereby adjusting the sampling point anywhere within a bit period of the high speed serial data. Adjustment circuitry 190 sinks a current, ΔI, from the negative current summing point and further sinks a current of I+ΔI from the positive current summing point. Each reference to a ΔI refers to an amount of additional current that is added or subtracted and is not related to any other ΔI shown or referenced. Stated differently, the various references to ΔI are not necessarily coupled or related.

Figure 7:
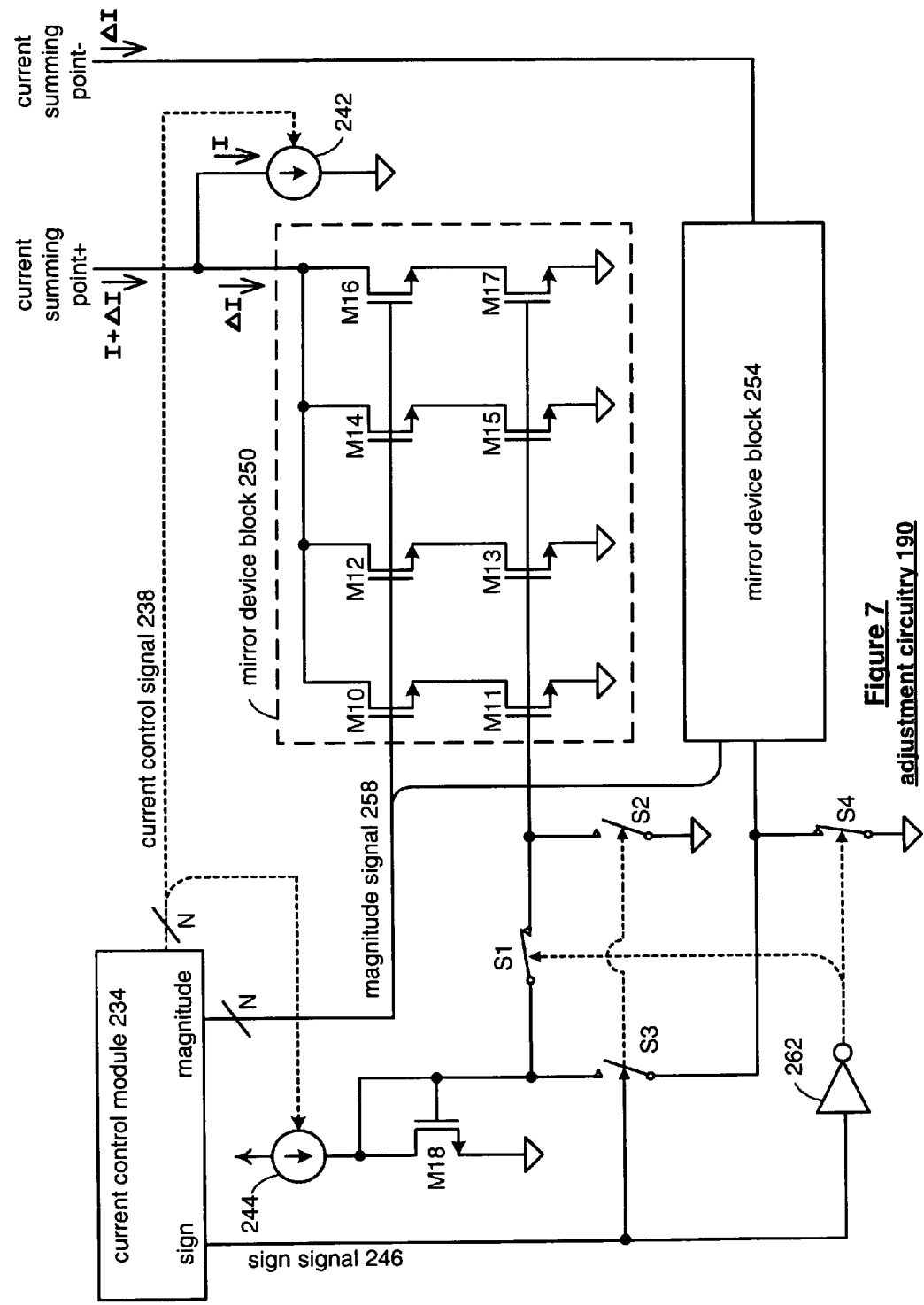
FIG. 7 is a schematic block diagram of adjustment circuitry according to one embodiment of the present invention.

FIG. 7 is a schematic block diagram of adjustment circuitry 190 according to one embodiment of the present invention. Adjustment circuitry 190 comprises a current control module 234, a reference current device M18, mirror device blocks 250 and 254, current sources 242 and 244, an inverter 262, and switches S1 through S4. Adjustment circuitry 190 operates to sink adjustable amounts of current from the positive current summing point and the negative current summing point of FIG. 6.

Current control module 234, operating under one of manual or automatic control, provides a plurality of signals to control the operation of adjustment circuitry 190. Current control module 234 provides a current control signal 238 to control current levels produced by current sources 242 and 244, a magnitude signal 258 to control the magnitude of the current sinked from the current summing points, and a sign signal 246 to control whether current is to be sinked from the positive current summing point or the negative current summing point. Current control signal 238 controls the magnitude of the current produced by current source 242 and 244 as shown herein FIG. 7 as well as current sources 210, 214, and 218 of FIG. 6.

A current mirror comprising reference current device M18, current source 244, and mirror device blocks 250 and 254 will sink a current of ΔI from the current summing points wherein a magnitude of ΔI is set by magnitude signal 258. Magnitude signal 258 comprises 4 control lines, wherein each control line operably activates one MOSFET switch of mirror device blocks 250 and 254. Mirror device block 250 comprises mirror devices M11, M13, M15, and M17 and MOSFET switches M10, M12, M14, and M16.

Each MOSFET switch will be biased into a triode region by the control line coupled to its gate. When biased into the triode region, the MOSFET switch has a very small ON resistance. When biased OFF by the control line, the MOSFET switch has a very large resistance. Accordingly, MOSFET switches M10, M12, M14, and M16 operably couple a corresponding mirror device to the positive current summing point. Mirror device block 254 is identical to mirror device block 250 and operates as described with respect to mirror device block 250 to produce current to the negative current summing point.

Mirror devices M11, M13, M15 and M17 receive a gate-to-source voltage from reference current device M18 that defines a ΔI current produced by the mirror devices according to the scaled length and width of the mirror devices relative to the length and width of the reference current device. The mirror devices of mirror device blocks 250 and 254 may be scaled to produce one of a linear and non-linear ΔI current. For example, the mirror devices may be scaled to produce a logarithmic current function.

Sign signal 246 is a single bit signal that determines whether current is sinked to the positive current summing point or the negative summing point. Sign signal 246 produced from current control module 234 is coupled to switches S2 and S3 and to inverter 262. An output of inverter 262 is coupled to switches S1 and S4. Sign signal 246 closes switches S2 and S3 when it is a logic 1 and closes switches S1 and S4, by virtue of inverter 262, when it is a logic 0. Switches S1 and S3 couple the gate-to-source voltage of reference current device M18 to mirror device block 250 or to mirror device block 254, respectively, based on the logical value of sign signal 246. Switches S2 and S4 couple a gate input of mirror device blocks 250 and 254, respectively, to circuit common thereby turning the mirror devices off.

When sign signal 246 is a logic 0, inverter 262 produces a logic 1 thereby closing switches S1 and S4. The logic 0 signal coupled to switches S2 and S3 open these switches. Closed switches S1 and S4 and open switches S2 and S3 activate mirror device block 250 and deactivates mirror device block 254. Accordingly, mirror device block 250 sinks the ΔI current from the positive current summing point. When sign signal 246 is a logic 1, switches S2 and S3 are closed and switches S1 and S4 are open thereby deactivating mirror device block 250 and activating mirror device block 254 to sink the ΔI current from the negative current summing point.

Figure 8:
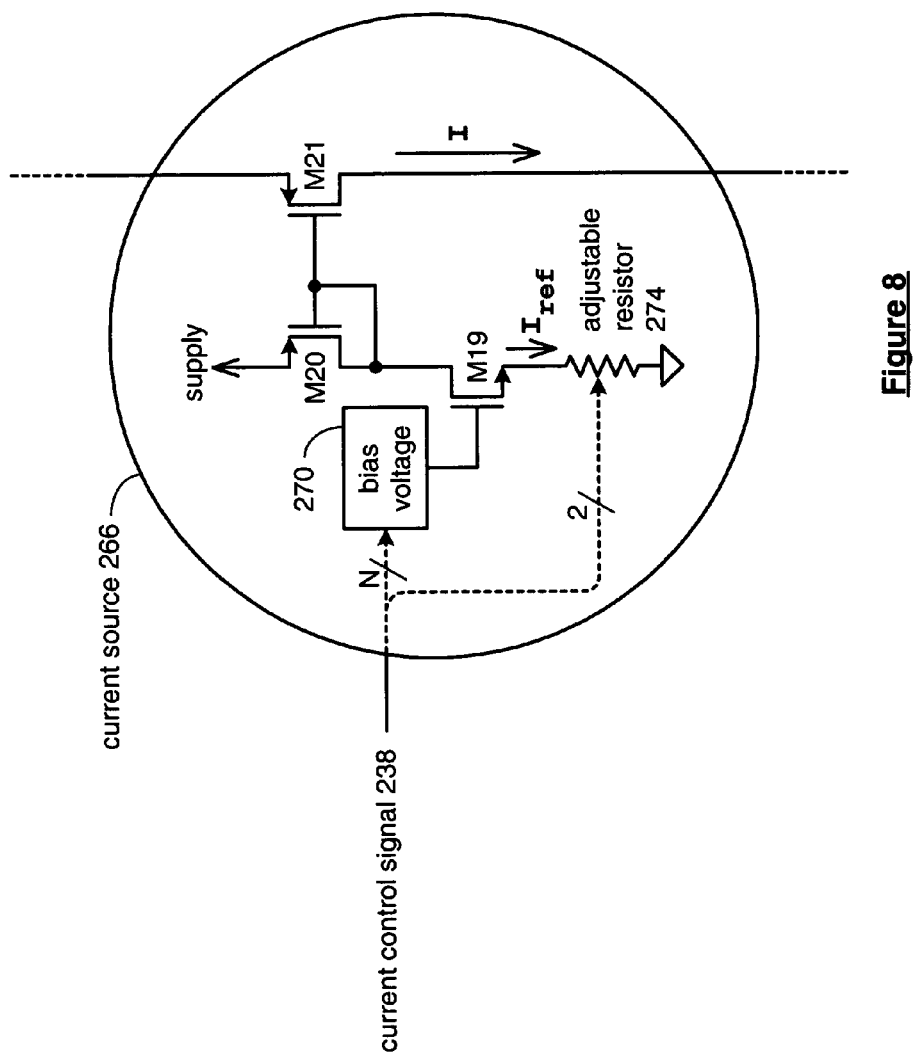
FIG. 8 is a schematic block diagram of an adjustable current source according to one embodiment of the present invention.

FIG. 8 is a schematic block diagram of an adjustable current source according to one embodiment of the present invention. An adjustable current source 266 functions to produce a current of magnitude I based on a value of an adjustable bias voltage and a value of an adjustable resistor, both operating according to current control signal 238 produced from current control module 234 of FIG. 7. Current source 266 comprises an adjustable bias voltage 270 operably coupled to produce a constant voltage to a gate of a transistor M19. An adjustable resistor 274 is coupled between a source of transistor M19 and circuit common. A drain of transistor M19 is coupled to a source and a gate of a reference current device M20. A drain of reference current device M20 is coupled to a supply, and a gate of reference current device M20 is coupled to a gate of mirror device M21.

A constant voltage produced by adjustable bias voltage 270 and a gate-to-source voltage produced by transistor M19 produces a constant voltage to adjustable resistor 274, causing a constant current $I_{ref}$ to flow through adjustable resistor 274. A magnitude of constant current $I_{ref}$ is determined by the resistance of adjustable resistor 274. The constant current $I_{ref}$ flows through transistor M19 and through reference current device M20. As is known to one of average skill in the art, the reference current flowing through reference current device M20 will be mirrored by mirror device M21 wherein the current in mirror device M21 is a function of the scaling of mirror device M21 relative to reference current device M20. Accordingly, the current produced by current source 266 is determined by the setting of current control signal 238. Adjustable current sources, such as adjustable current sources 210, 214, and 218 of FIG. 6, produce matching currents throughout the inventive circuit due to the relative matching of component values by the IC manufacturing process.

Figure 9:
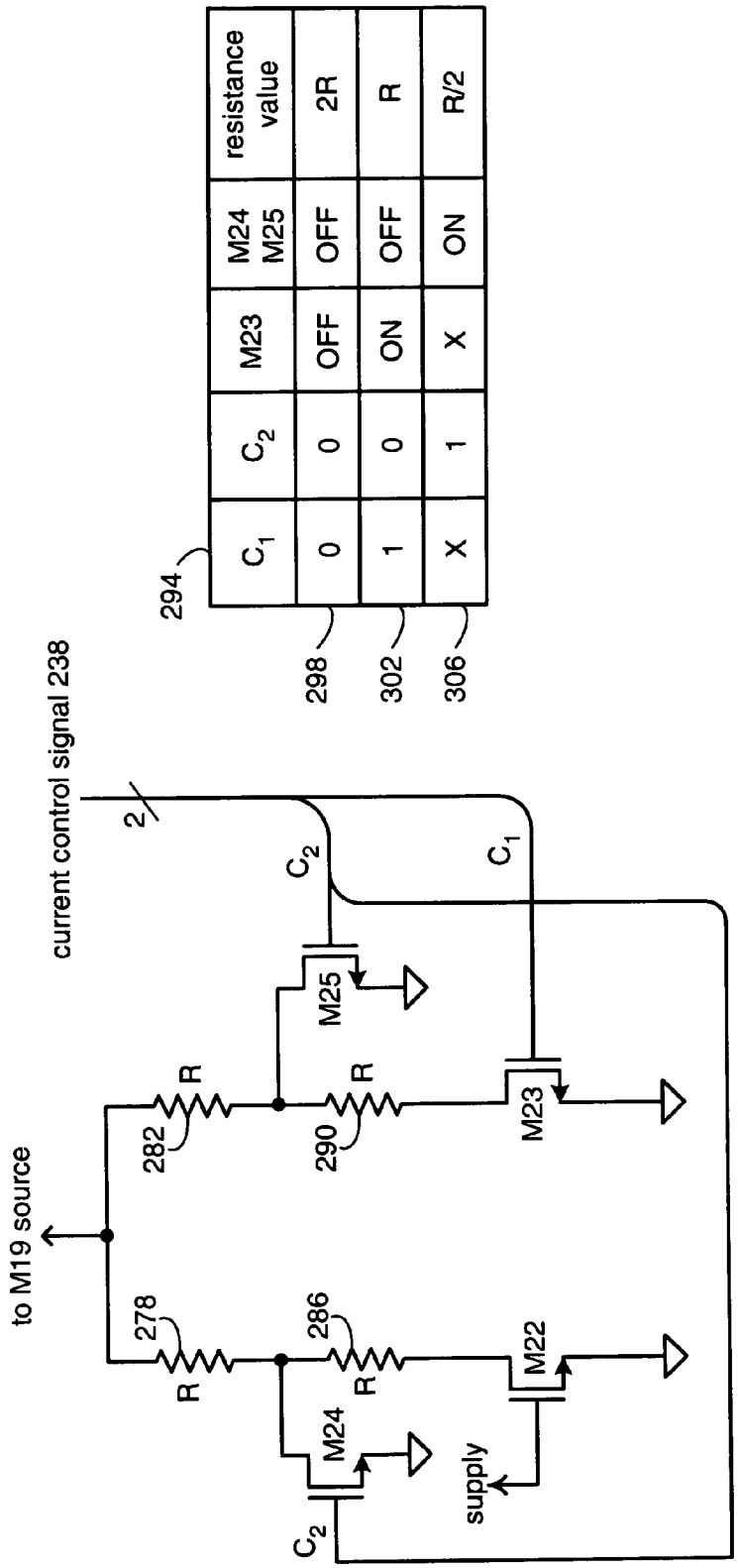
FIG. 9 is a schematic block diagram illustrating an adjustable resistor according to one embodiment of the present invention.

FIG. 9 is a schematic block diagram illustrating an adjustable resistor according to one embodiment of the present invention. The adjustable resistor, such as adjustable resistor 274 of FIG. 8, comprises a plurality of resistive elements coupled in a series/parallel configuration coupled into and out of circuit connectivity or operation by a plurality of MOSFET switches. As can be seen in FIG. 9, resistive elements 278 and 286 are coupled in series with a MOSFET switch M22, and resistive elements 282 and 290 are coupled in series with a MOSFET switch M23. The series combination of resistive elements 278, 286 and MOSFET switch M22 are further coupled in parallel to the series combination of resistive elements 282, 290 and MOSFET switch M23. Current control signal 238, produced from current control module 234 of FIG. 7, comprises two control lines $C_1$ and $C_2$ that are binary signals having values of a logic 0 and a logic 1. Control line $C_1$ is coupled to a gate of MOSFET switch M23 and control line $C_2$ is coupled to a gate of MOSFET switch M24 and to a gate of MOSFET switch M25. A gate of MOSFET switch M22 is coupled to supply thereby permanently turning on MOSFET switch M22.

A table 294 defines the resistive values produced by control lines $C_1$ and $C_2$. As can be seen in row 298 of table 294, when control lines $C_1$ and $C_2$ are both a logic 0, switches M23, M24 and M25 are biased to the off position, thus having a very high resistance. With control lines $C_1$ and $C_2$ at a logic 0, the series combination of resistive elements 282 and 290 and switch M23 is effectively an open circuit, thus the resistance from the source of transistor M19 of FIG. 8 and circuit common will be the series combination of resistive elements 278 and 286 and switch M22, thus forming a resistance value of 2R (ignoring the very small ON resistance of switch M22).

When current control line $C_1$ is a logic 1 and current control line $C_2$ is a logic 0, as illustrated in row 302 of table 294, switch M23 is biased ON and switches M24 and M25 are biased OFF. In this configuration, the resistive value of adjustable resistor 274 is the parallel combination of the series connected resistive elements 278 and 286, and switch M22 and series connected resistive elements 282 and 290 and switch M23. Thus, the total resistance as seen between the source of transistor M19 and circuit common is simply R. Continuing with row 306 of table 294, when current control line $C_2$ is a logic 1, switches M24 and M25 are biased to a low resistance triode region effectively coupling resistive elements 278 and 282 to circuit common. In this condition, resistive elements 278 and 282 are coupled in parallel producing a resistance value of R/2. When control line $C_2$ is a logic 1, resistive elements 286 and 290 and switches M22 and M23 are all coupled to circuit common thereby removing them from the circuit. Accordingly, the logic state of control line $C_1$ is a "don't care" term illustrated by an "X" in row 306 of table 294.

Adjustable resistor 274 is illustrated with four resistive elements, but it will be obvious to one of average skill in the art that any number of resistive elements may be coupled in the series/parallel configuration to achieve a desired resolution of adjustable resistor 274. Likewise, resistive elements 278, 282, 286 and 290 are illustrated as having equal resistances. It should be further obvious to one of average skill in the art, that the resistive elements can be formed in any number of resistive ratios to achieve a non-linear adjustable resistor. For example, the resistive elements could be formed to produce a logarithmic resistive function. The resistive elements may be formed as traditional resistive elements or may be formed as MOSFET transistors configured to operate in a linear range as resistive elements.

Figure 10:
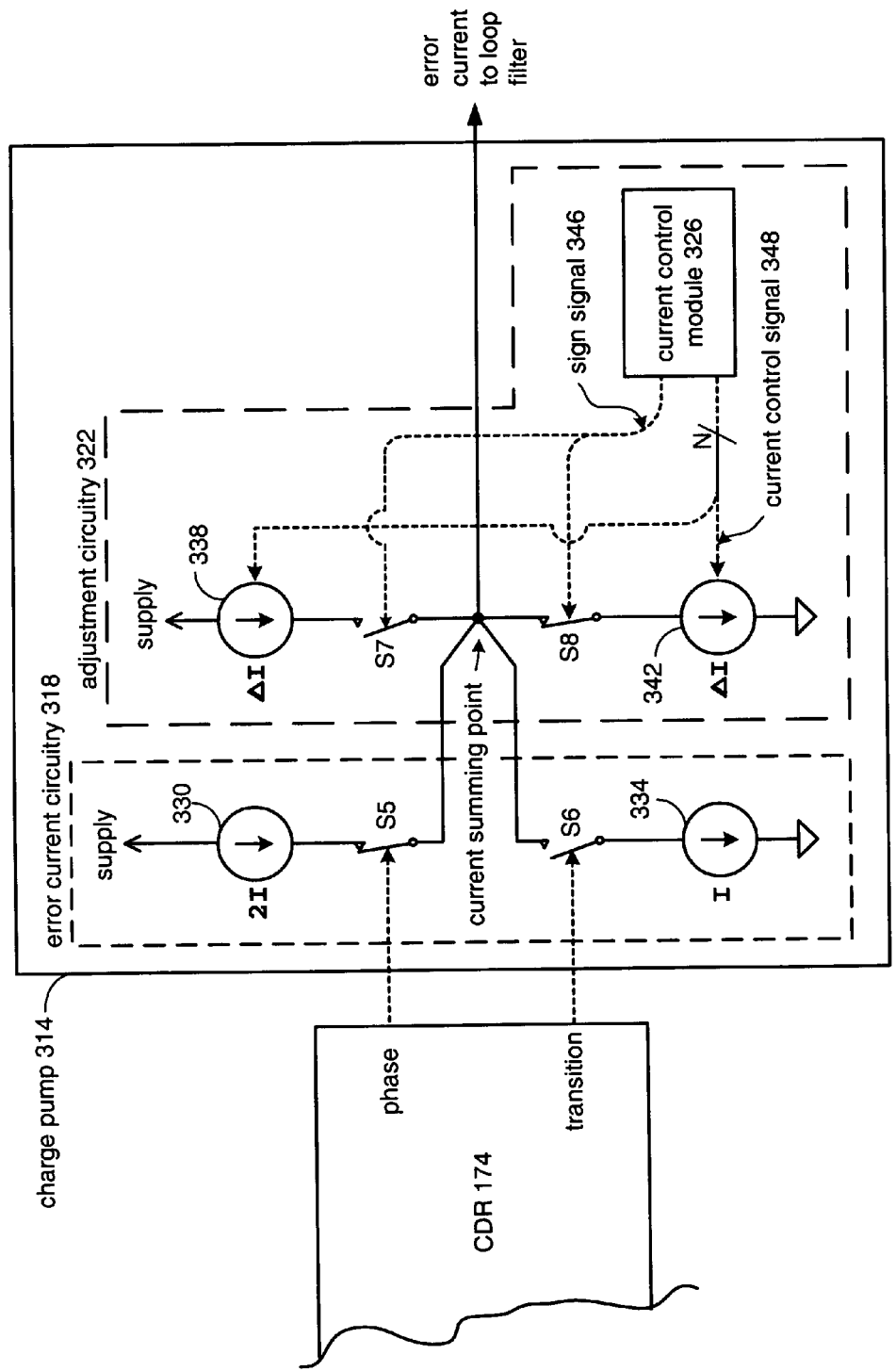
FIG. 10 is a schematic block diagram illustrating an alternate embodiment of a charge pump.

FIG. 10 is a schematic block diagram illustrating an alternate embodiment of a charge pump. A charge pump 314 comprises an error current circuitry 318 and an adjustment circuitry 322. Charge pump 314 is coupled to receive phase and transition information from CDR module 174 (of FIG. 5) and to produce therefrom an error current to the loop filter (not shown). Error current circuitry 318 comprises a series combination of a current source 330, a switch S5, a switch S6 and a current sink 334. The series combination is coupled between a supply and a circuit common. Switches S5 and S6 are coupled to a current summing point, which produces the error current to the loop filter. As can be seen in FIG. 10, current source 330 is coupled to the current summing point by switch S5 operating under control of the phase information. Current sink 334 removes current from the current summing point when switch S6 is closed by the transition information. Current source 330 is scaled to a current magnitude of twice the current magnitude of current sink 334 due to the phase information typically having a period of one-half the period of the transition information when phase-locked. Thus, current source 330 produces twice the current of current sink 334, thereby generating a net current of 0 when the sampling point is positioned in the center of a bit period of the serial data.

Adjustment circuitry 322 comprises an adjustable current source 338 and adjustable current sink 342 connected in series with switches S7 and S8. Switches S7 and S8 are also coupled to the current summing point, thus allowing adjustable current source 338 and adjustable current sink 342 to add or subtract current to the error current, thereby allowing the sampling point to be positioned anywhere within a bit period of the serial data. Switches S7 and S8 of adjustment circuitry 322 are operated by a sign signal 346 that open and close switches S7 and S8 as necessary to move the sampling point under command of a current control module 326. Current source 338 and current sink 342 operate as adjustable current sources as was described with respect to FIG. 8. A current control signal 348 produced from current control module 326 controls the ΔI current as required to position the sampling point anywhere within the bit period.

Figure 11:
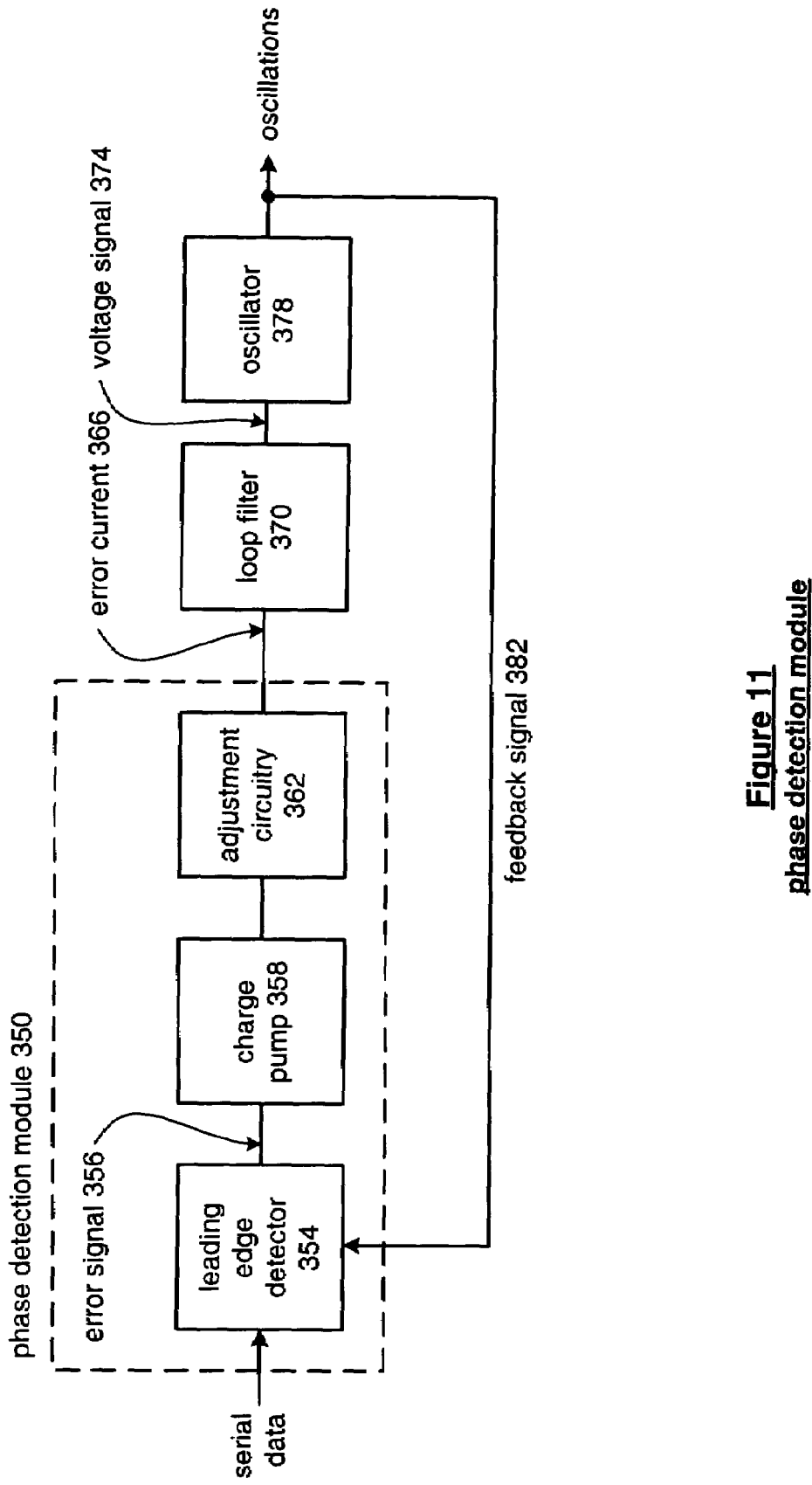
FIG. 11 is a schematic block diagram illustrating a phase detection module of the present invention.

FIG. 11 is a schematic block diagram illustrating a phase detection module of the present invention. A phase detection module 350, comprising a leading edge detector 354, a charge pump 358, and an adjustment circuitry 362, receives serial data into leading edge detector 354 and produces an error current 366 to a loop filter 370. Loop filter 370 produces a voltage signal 374 to an oscillator 378, which produces oscillations proportional to voltage signal 374. Additionally, the output of oscillator 378 is produced to leading edge detector 354 as feedback signal 382. Adjustment circuitry 362 of phase detection module 350 operates to change error current 366 to position a sampling point anywhere within a bit period of the received serial data.

Figure 12:
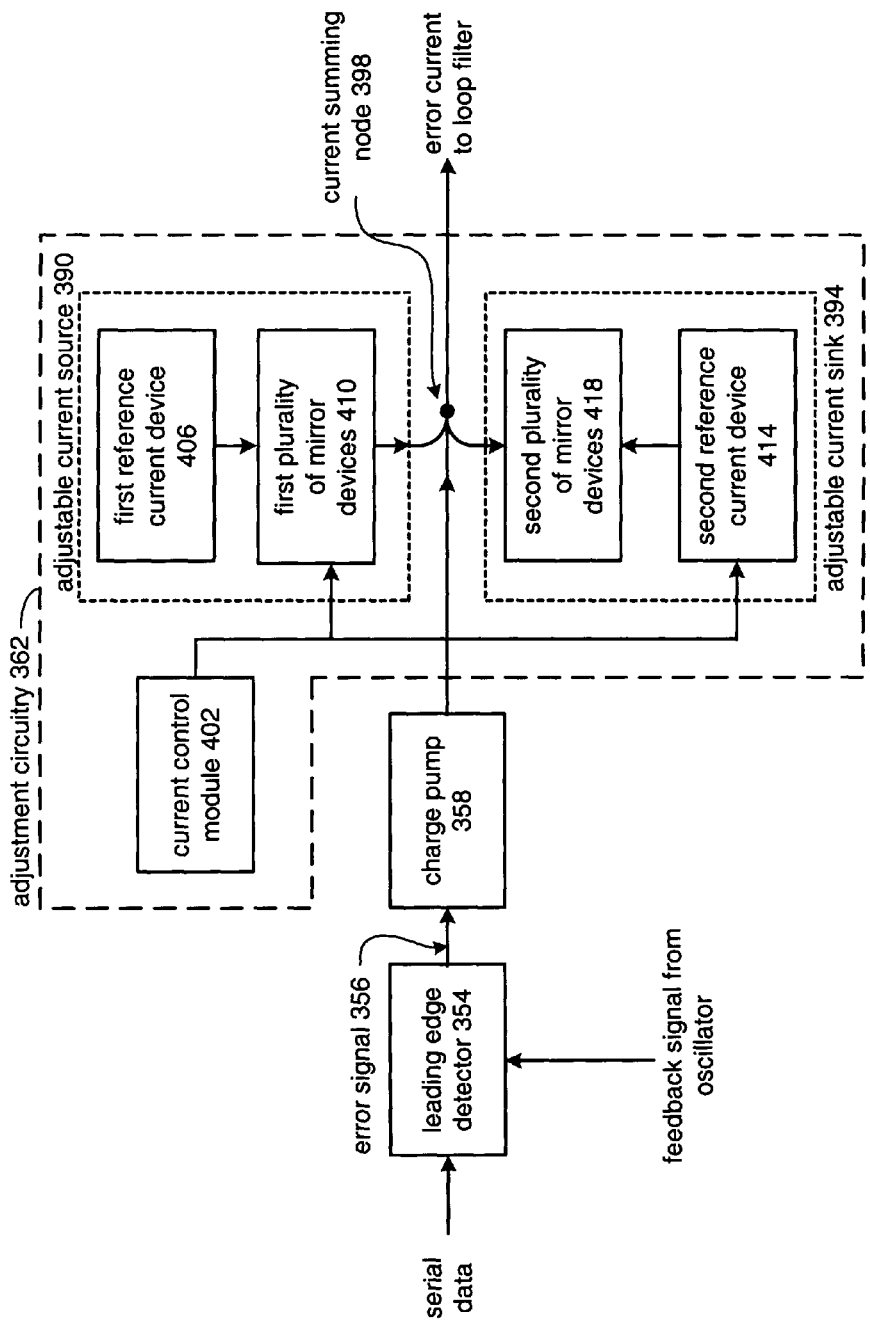
FIG. 12 is a schematic block diagram of a phase detection module illustrating the operation of adjustment circuitry.

FIG. 12 is a schematic block diagram of phase detection module 350 illustrating the operation of adjustment circuitry 362. Serial data is received into leading edge detector 354, which produces an error signal 356 based on the relative phases of the received serial data and a feedback signal from an oscillator (not shown). Error signal 356 produced by leading edge detector 354 is coupled to charge pump 358, which produces an error current to the loop filter (not shown) proportional to the received error signal. Adjustment circuitry 362 comprises an adjustable current source 390 and an adjustable current sink 394 coupled in series with a current summing node 398. A current control module 402 operating under one of manual or automatic control is coupled to adjustable current source 390 and adjustable current sink 394. A first reference current device 406 provides a reference signal through a first plurality of mirror devices 410 which produces a scaled ΔI current to the current summing node 398. The addition of the ΔI current to the error current functions to increase the oscillation frequency of an oscillator, for example, oscillator 378 of FIG. 11, thereby adjusting a sampling point within a bit period of the serial data.

Adjustable current sink 394 comprises a second reference current device 414 and a second plurality of mirror devices 418 operating under control of current control module 402. Second reference current device 414 couples a reference signal to the second plurality of mirror devices 418 that removes current from current summing node 398, thereby effectively reducing the frequency of oscillations and moving the sampling point in the opposite direction relative to the sampling point adjustment of the adjustable current source 390. The phase detection module of FIG. 12 can, therefore, be used to position a sampling point anywhere within a bit period of the received serial data.

Figure 13:
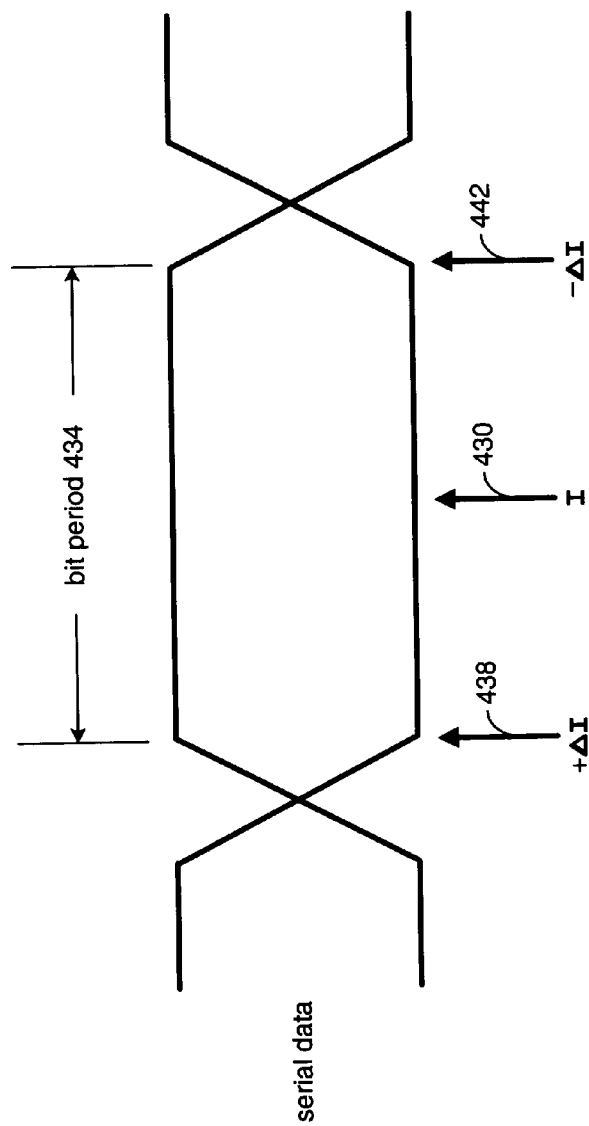
FIG. 13 is an eye diagram illustrating the positioning of a sampling point within a bit period according to the methods of the present invention.

FIG. 13 is an eye diagram illustrating the positioning of a sampling point within a bit period according to the methods of the present invention. In normal operation, a sampling point 430 is approximately positioned to the center of bit period 434 by an embodiment of the invention as previously described. To change the relative position of the sampling point 430, the inventive adjustment circuitry adds or subtracts a ΔI current, for example, +ΔI current 438 and −ΔI current 442, to position the sampling point anywhere within bit period 434.

Figure 14:
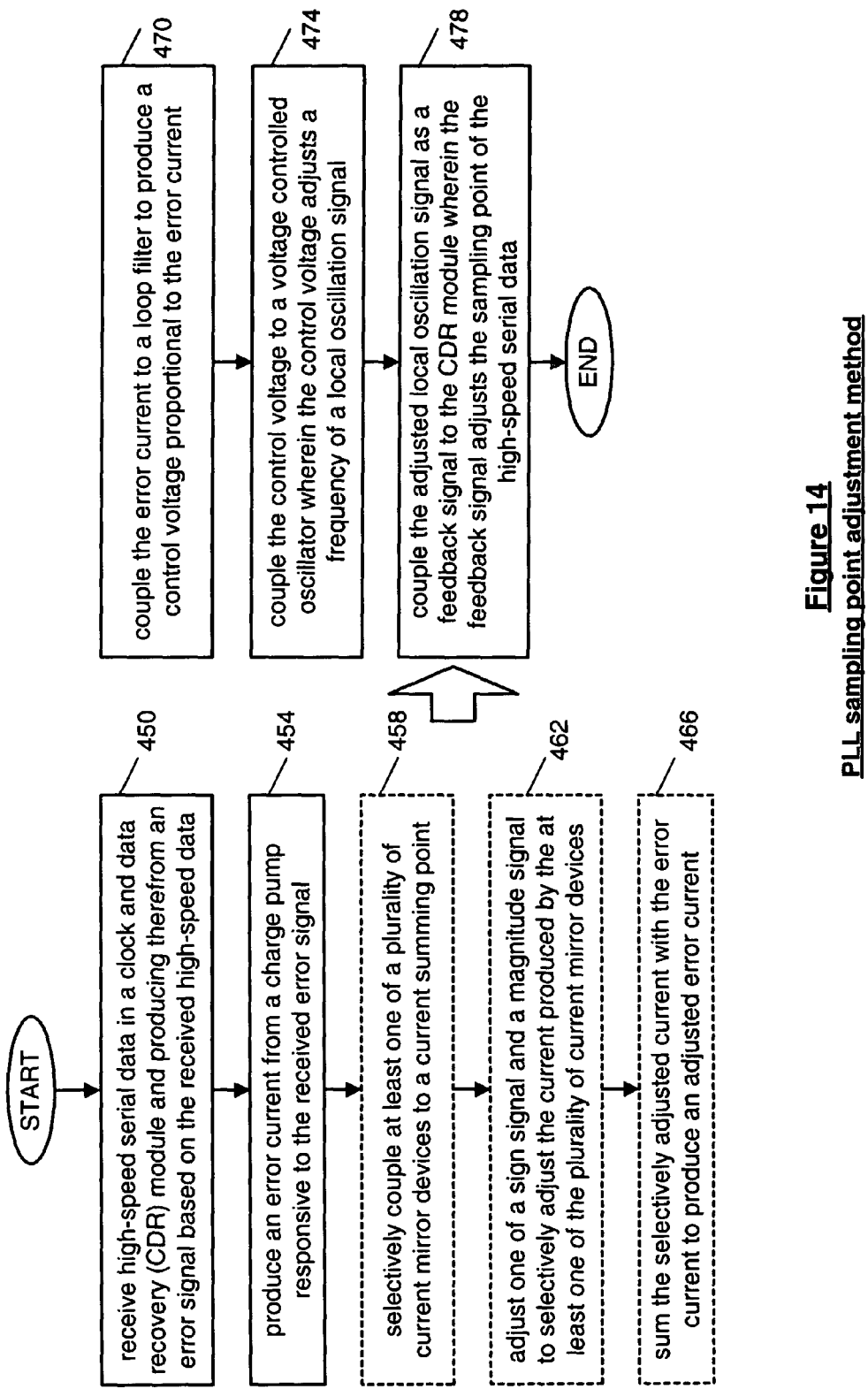
FIG. 14 illustrates a method of sampling point adjustment of high-speed serial data according to one embodiment of the invention.

FIG. 14 illustrates a method of sampling point adjustment of high-speed serial data according to one embodiment of the invention. High-speed serial data is received in a clock and data recovery (CDR) module. The CDR module produces an error signal based on the received high-speed serial data (step 450). The error signal includes one of a phase information and a transition information. The phase information indicates a relative phase difference between a feedback signal and the high-speed serial data. The transition information indicates a logic level change in the high-speed serial data. A charge pump, operably coupled to receive the error signal produces an error current responsive to the received error signal (step 454). In normal operation, a PLL operates to maintain the sampling point approximately centered in a bit period of the high-speed serial data. Steps 458 through 470 are optionally used to adjust the error current to selectively move the sampling to any desired location within the bit period of the high-speed serial data. Circuits within the PLL selectively couple at least one of a plurality of current mirror devices to a current summing point (step 458). Each current mirror device of the plurality of current mirror devices produces a current responsive to at least one reference current device and to the number of current mirror devices of the plurality of current mirror devices operably coupled to the current summing points. The plurality of current mirror devices are scaled in length and width to produce current relative to at least one reference current device. Manual or automated control adjusts one of a sign signal and a magnitude signal to selectively adjust the current produced by the at least one of the plurality of current mirror devices (step 462). The selectively adjusted current is summed with the error current to produce an adjusted error current (step 466). The error current is coupled to a loop filter which produces a control voltage proportional to the error current (step 470) then the control voltage is coupled to a voltage controlled oscillator wherein the control voltage adjusts a frequency of a local oscillation signal (step 474). To complete the loop, the adjusted local oscillation signal is coupled, as a feedback signal, to the CDR module wherein the feedback signal adjusts the sampling point of the high-speed serial data (step 478).

The invention disclosed herein is adaptable to various modifications and alternative forms. Therefore, specific embodiments have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A phase-locked loop (PLL) for producing sampling points for high-speed serial data, comprising:
   a clock and data recovery (CDR) module coupled to receive the high-speed serial data, the CDR module producing phase information;
   a charge pump for producing an error current that reflects a phase difference between a feedback signal and a phase of the high-speed serial data based on the phase information;
   a loop filter coupled to receive the error current, wherein the loop filter converts the error current to a voltage signal;
   a voltage controlled oscillator (VCO) coupled to receive the voltage signal, wherein the VCO produces a local oscillation that corresponds to the voltage signal and further wherein the local oscillation is produced to the CDR module as the feedback signal; and
   wherein the charge pump further includes adjustment circuitry for selectively adjusting the error current to cause the feedback signal to be phase adjusted to any desired point within a period of each bit of the high-speed serial data.

2. The PLL of claim 1 wherein the adjustment circuitry comprises an adjustable current source coupled to selectively sink current from a positive current summing point and a negative current summing point of the charge pump.

3. The PLL of claim 2 wherein the adjustable current source further includes a reference current device and a plurality of mirror devices coupled in a current mirror configuration wherein the plurality of mirror devices are scaled in length and width to conduct specified current levels relative to the reference current device.

4. The PLL of claim 2 wherein the charge pump further comprises a plurality of current sources formed to supply current based on a bias voltage and an adjustable resistor.

5. The PLL of claim 4 wherein the adjustable resistor comprises a plurality of resistors coupled in parallel wherein at least two of the plurality of resistors are selectively coupled in parallel.

6. The PLL of claim 4 wherein at least one of the plurality of resistors consists of a MOSFET transistor configured to operate in a linear range as a resistor.

7. The PLL of claim 4 wherein at least one of the plurality of resistors consists of resistive elements coupled in series with selectively operated switches.

8. The PLL of claim 4 wherein the charge pump further comprises a common mode feedback block coupled at an output of the charge pump for removing a common mode current level from the error current.

9. The PLL of claim 1 wherein the charge pump further includes at least one current source for selectively adding current to the error current and further includes at least one current sink for selectively subtracting current from the error current.

10. The PLL of claim 8 wherein the current sink includes at least one adjustable current source coupled between a current summing point and circuit common.

11. The PLL of claim 9 wherein the adjustment circuitry further includes at least two adjustable current sinks coupled between positive and negative current summing points and circuit common wherein each is coupled in parallel to a corresponding current sink that sink and source current responsive to at least one of transition and phase information.

12. The PLL of claim 10 wherein the adjustment circuitry further includes a current control module for providing control signals to control an amount of current sinked by the at least two adjustable current sinks.

13. A method for adjusting a sampling point of high-speed serial data, the method comprising:
   receiving high-speed serial data in a clock and data recovery (CDR) module and producing therefrom an error signal based on the received high-speed serial data;
   producing an error current from a charge pump responsive to the received error signal;
   adjusting the error current to selectively position the sampling point to any desired point within a bit period of the received high-speed serial data;
   coupling the error current to a loop filter to produce therefrom a control voltage proportional to the error current;
   coupling the control voltage to a voltage controlled oscillator wherein the control voltage adjusts a frequency of a local oscillation signal; and
   coupling the adjusted local oscillation signal as a feedback signal to the CDR module wherein the feedback signal adjusts the sampling point of the high-speed serial data.

14. The method of claim 13 wherein the error signal includes at least one of phase information and transition information.

15. The method of claim 13 wherein the step of adjusting the error current further includes selectively coupling at least one of a plurality of current mirror devices to a current summing point.

16. The method of claim 14 wherein the plurality of current mirror devices are scaled in length and width to produce current relative to at least one reference device.

* * * * *